(12) United States Patent
Vishakantaiah et al.

(10) Patent No.: US 12,022,688 B2
(45) Date of Patent: *Jun. 25, 2024

(54) ELECTRONIC DEVICE HAVING AN ORGANIC LIGHT EMITTING DISPLAY

(71) Applicant: Intel Corporation, Santa Clara, CA (US)

(72) Inventors: Praveen Vishakantaiah, Hillsboro, OR (US); Zhiming J. Zhuang, Sammamish, WA (US); Hong W. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/829,036

(22) Filed: May 31, 2022

(65) Prior Publication Data
US 2022/0293882 A1     Sep. 15, 2022

Related U.S. Application Data

(60) Continuation of application No. 16/870,425, filed on May 8, 2020, now Pat. No. 11,349,102, which is a
(Continued)

(51) Int. Cl.
*H10K 50/87* (2023.01)
*F28D 15/02* (2006.01)
(Continued)

(52) U.S. Cl.
CPC ............ *H10K 50/87* (2023.02); *F28D 15/02* (2013.01); *H01K 5/02* (2013.01); *H10K 10/466* (2023.02); *H10K 59/00* (2023.02); *H10K 85/113* (2023.02)

(58) Field of Classification Search
CPC ...... F28D 15/02; H10K 10/466; H10K 50/87; H10K 85/113; H10K 59/00;
(Continued)

(56) References Cited

U.S. PATENT DOCUMENTS

| 7,903,227 B2 * | 3/2011 | Kang ................ G02F 1/133603 349/161 |
| 10,658,624 B2 * | 5/2020 | Vishakantaiah et al. .................... H01L 51/520 257/40 |

(Continued)

FOREIGN PATENT DOCUMENTS

KR    10-2014-0091263 A    7/2014

OTHER PUBLICATIONS

International Search Report and Written Opinion, mailed Sep. 9, 2016, issued in related International Application No. PCT/US2015/065062, 15 pages.
(Continued)

*Primary Examiner* — Karen Kusumakar
(74) *Attorney, Agent, or Firm* — Alliance IP, LLC

(57) ABSTRACT

An electronic device may include an organic light emitting display (OLED), a heat generating device, and a heat spreading device. The heat generating device may provide heat directly to the heat spreading device, and the heat spreading device is to dissipate the heat from the heat generating device and evenly heat the OLED and lower a driving voltage of the OLED to reduce power consumption of the OLED.

25 Claims, 4 Drawing Sheets

Related U.S. Application Data division of application No. 15/775,374, filed as application No. PCT/US2015/065062 on Dec. 10, 2015, now Pat. No. 10,658,624.

(51) Int. Cl.
  *H01K 5/02* (2006.01)
  *H10K 10/46* (2023.01)
  *H10K 59/00* (2023.01)
  *H10K 85/10* (2023.01)

(58) Field of Classification Search
  CPC ...... H10K 59/8794; H10K 59/82; H01K 5/02; H01L 51/52; G06F 2200/201; G06F 1/20
  USPC .................................. 257/30, 40; 438/82, 99
  See application file for complete search history.

(56) References Cited

U.S. PATENT DOCUMENTS

| | | | |
|---|---|---|---|
| 2005/0068738 A1* | 3/2005 | Kim ..................... | H05K 7/2099 |
| | | | 257/E23.112 |
| 2009/0205696 A1* | 8/2009 | Koester ................. | H10N 10/13 |
| | | | 136/201 |
| 2010/0038053 A1 | 2/2010 | Maxik et al. | |
| 2011/0199769 A1 | 8/2011 | Bretschneider et al. | |
| 2013/0044476 A1 | 2/2013 | Bretschneider et al. | |
| 2013/0082908 A1* | 4/2013 | Lynch .................... | H10K 50/87 |
| | | | 345/76 |
| 2013/0139524 A1 | 6/2013 | Kim et al. | |
| 2014/0217272 A1 | 8/2014 | Ramer et al. | |
| 2015/0055300 A1 | 2/2015 | Hsieh et al. | |
| 2016/0162093 A1 | 6/2016 | Kim et al. | |
| 2017/0003723 A1 | 1/2017 | Jun et al. | |
| 2017/0033797 A1 | 2/2017 | Jung et al. | |

OTHER PUBLICATIONS

Restriction/Election Requirement mailed Jan. 24, 2019 for U.S. Appl. No. 15/775,374, 6 pages.

Office Action mailed Apr. 4, 2019 for U.S. Appl. No. 15/775,374, 12 pages.

Office Action mailed Oct. 10, 2019 for U.S. Appl. No. 15/775,374, 11 pages.

Restriction/Election Requirement mailed Aug. 11, 2021 for U.S. Appl. No. 16/870,425, 6 pages.

Office Action mailed Oct. 22, 2021 for U.S. Appl. No. 16/870,425, 12 pages.

\* cited by examiner

ELECTRONIC DEVICE HAVING AN ORGANIC LIGHT EMITTING DISPLAY

CROSS REFERENCE TO RELATED APPLICATIONS

The present application is a continuation application of U.S. patent application Ser. No. 16/870,425, now U.S. Pat. No. 11,349,102, which is a division application of U.S. patent application Ser. No. 15/775,374, now U.S. Pat. No. 10,658,624, which is a national phase entry under 35 U.S.C. § 371 of International Application No. PCT/US2015/065062, filed Dec. 10, 2015, entitled "ELECTRONIC DEVICE HAVING AN ORGANIC LIGHT EMITTING DISPLAY," which designates the United States of America, the entire disclosure of which is hereby incorporated by reference in its entirety and for all purposes.

BACKGROUND

1. Field

Embodiments may relate to an organic light emitting display (OLED).

2. Background

Organic light emitting displays (OLEDs) are made from luminescent organic materials that generate light when a direct current passes through the materials. Certain characteristics of OLEDs may make them appealing to those skilled in the art of electronic display technology. For example, OLEDs may have a higher contrast and dynamic range, higher color gamut and faster response time. OLED displays may be used in many applications such as displays for portable electronic devices, flat screen computer displays, and/or automobile stereo displays.

BRIEF DESCRIPTION OF THE DRAWINGS

Arrangements and embodiments may be described in detail with reference to the following drawings in which like reference numerals refer to like elements and wherein.

DETAILED DESCRIPTION

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Further, particular features, structures, or characteristics may be combined in any suitable manner in one or more embodiments.

As used hereafter, the term OLED may be an organic light emitting display, an organic light emitting diode and/or an organic light emitting diode display.

Embodiments may relate to an electronic device or an electronic system. An electronic device (or electronic apparatus) may be any one of a mobile terminal, a smartphone, a mobile device, a mobile computing platform, a mobile platform, a laptop computer, a tablet, an ultra-mobile personal computer, a mobile Internet device, a personal digital assistant, a display device, a television (TV), etc. The electronic device may also be referred to as a terminal.

Size is relevant for mobile computer systems, such as tablets, laptops, smartphones, etc. Consumers may desire thinner and smaller devices with all components and sub systems miniaturized as much as possible, with the exception of a display.

In a compact electronic system (such as an ultra thin notebook, tablet or smartphone), heat generated by electronic components of the electronic system may need to be discharged to outside of the electronic system. Arrangements may include active cooling designs such as a fan or a passive heat sink to dissipate the heat to outside. However, these components may be large or bulky, which may prevent their usage in a compact design.

Behaving like a semiconductor, OLED material has a unique feature that a driving voltage of the OLED decreases with an increasing of the temperature. Embodiments may take advantage of this feature of an OLED. It may allow for an improved power efficiency of operating the OLED. As used hereinafter, the OLED may be an OLED display.

Embodiments may use a thin heat spreading device to efficiently distribute heat evenly to the OLED. The thin heat spreading device may be a heat vapor chamber, a heat pipe, a plurality of heat pipes, a heat sink, and/or a heat ribbon, for example. The heat spreading device may also be referred to as a heat spreader or a heat spreader device. Components of the heat spreading device may also be referred to as heat exchange assisting components.

Figure 1:
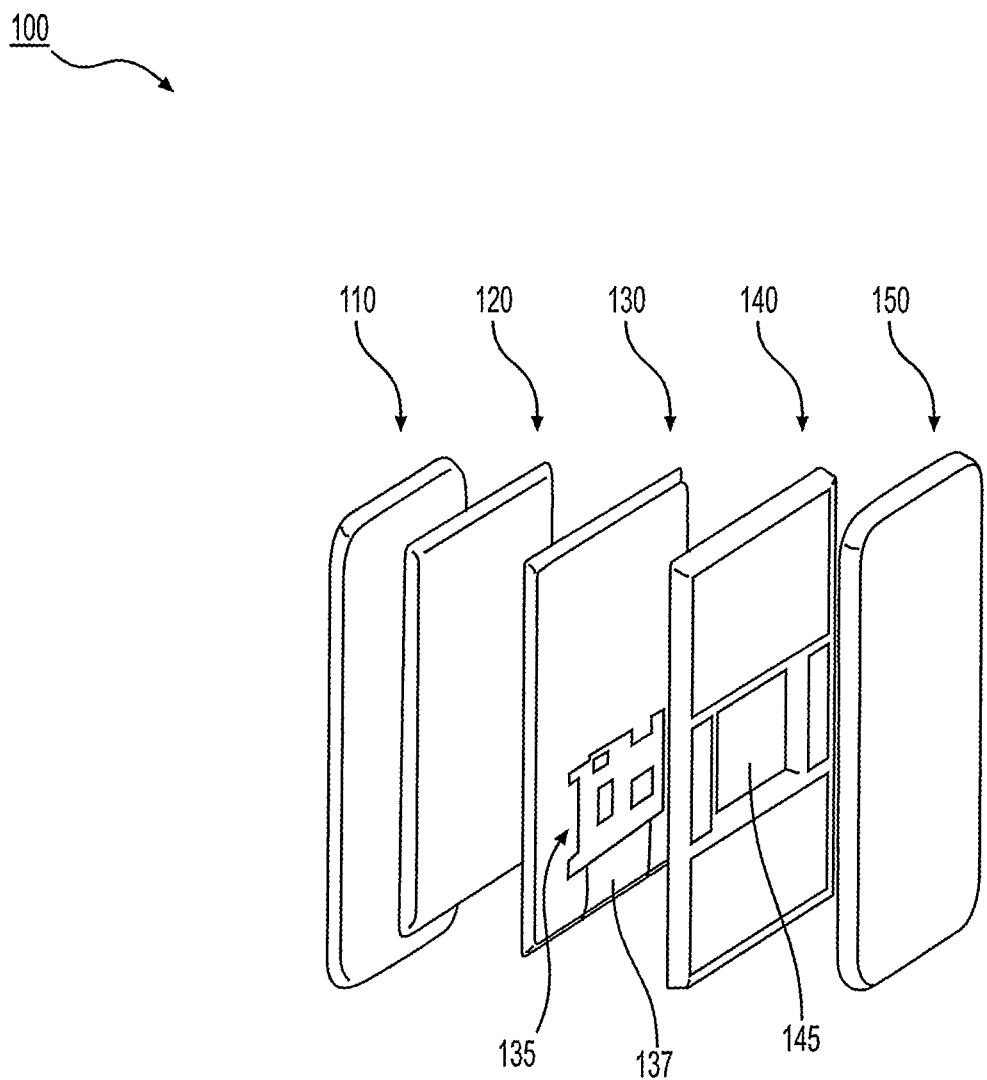
FIG. 1 is a separated view of an electronic device according to an example embodiment.

FIG. 1 is a separated view of an electronic device according to an example embodiment. Other embodiments and configurations may also be provided.

FIG. 1 shows an electronic device 100, such as a smartphone, for example. Other type of electronic devices may also be used.

The electronic device 100 may include a front cover 110 (or cover glass), an OLED 120 (or OLED structure), a heat separating device 130, a battery structure 140 and a back cover 150.

The front cover 110 may be a glass cover, for example. The front cover 110 may also be called a cover glass.

The OLED 120 may be called an OLED structure or an OLED device.

The heat spreading device 130 may be on one side of the OLED 120 such that the OLED 120 is between the front cover 110 and the heat spreading device 130. The heat spreading device 130 may include heat dissipating components such as a vapor chamber, a heat pipe, a plurality of heat pipes, a heat ribbon, and/or a heat sink, for example. Other heat dissipating components may also be used.

A heat generating device 135 may be provided at one side of the heat spreading device 130. In at least one embodiment, the heat generating device 135 may directly contact a central area of the one side (or surface) of the heat spreading device 130. During operation of the electronic device, the heat generating device 135 may produce heat that may be absorbed by the heat spreading device 130, for example. The heat spreading device 130 may dissipate the heat from the heat generating device 135, and the heat may lower a driving voltage of the OLED 120.

The heat generating device 135 may include any one of a plurality of electronic components, such as components to operate the OLED 120. In at least one embodiment, the heat generating device 135 may include a processor on a circuit board. The processor may be attached to the circuit board. In at least one embodiment, the processor may directly contact the heat spreading device 130. For example, the processor may directly contact a center area of a surface of the heat generating device 135. The heat generating device 135 may provide heat and signals to the OLED 120.

A cable 137, such as a flexible flat cable, may be coupled between the circuit board (of the heat generating device 135) and the OLED 120. The cable 137 may electrically connect the heat generating device 135 to the OLED 120 in order to provide display instructions, power, etc. Data, information and power may be communicated between the heat generating device 135 and the OLED 120. The cable 137 may be provided around a bottom edge of the heat spreading device 130.

The heat generating device 135 may include a subsystem with components mounted on (or attached to) a circuit board and/or may be referred to as a motherboard in an electronic or computing device. The heat generators in the heat generating device 135 may include, but are not limited to, inductors, resistors, processors, wireless communication modules (WiFi, Wireless Wide Area Network (WWAN)).

The battery structure 140 may be provided at one side of the heat spreading device 130 such that the heat spreading device 130 is between the OLED 120 and the battery structure 140. The battery structure 140 may include a battery to provide power for components of the heat generating device 135 and the OLED 120. FIG. 1 shows an opening 145 in the battery structure 140. When the electronic device 100 is provided in a compact configuration, portions of the heat generating device 135 may be provided in the opening 145 of the battery structure 140. The power from the battery may be connected to a subsystem of the heat generating device via a power cable. The power for the OLED 120 is provided via the cable 137. The cable 137 may provide video signals, control signals and power to the OLED.

The back cover 150 (or rear cover) may be provided at one side of the battery structure 140 such that the battery structure 140 is between the heat spreading device 130 and the back cover 150.

Figure 2:
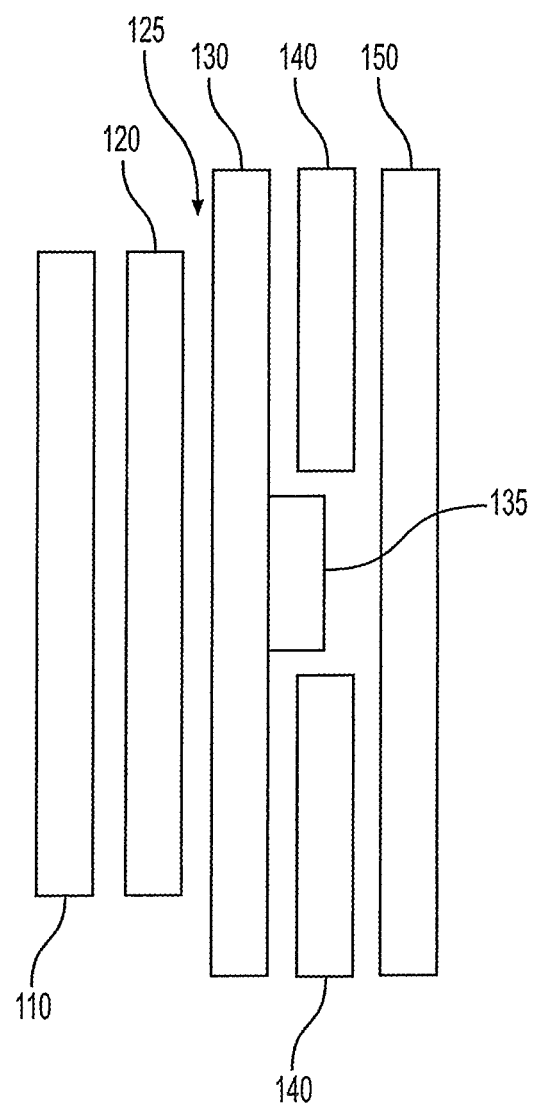
FIG. 2 is a side view of an electronic device according to an example embodiment.

FIG. 2 is a side view of the electronic device 100 according to an example embodiment. Other embodiments and configurations may also be provided.

As shown, the electronic device 100 includes the front cover (or cover glass) 110 and the OLED 120 at one side of the front cover 100. The heat spreading device 130 may be provided at one side of the OLED 120. In at least one embodiment, an air gap 125 may be provided between the OLED 120 and the heat spreading device 130. The battery structure 140 may be provided at one side of the heat spreading device 130, and the back cover 150 may be provided at one side of the battery structure 140.

The heat spreading device 130 may now be described in greater detail.

The heat spreading device 130 may include a vapor chamber, a heat pipe, a plurality of heat pipes, a heat sink and/or a heat ribbon, for example. The heat spreading device 130 may be provided between a back surface of the OLED 120 and the heat generating device 135, which may include a circuit board for operating the OLED 120. In at least one embodiment, the heat spreading device 130 may physically contact both the OLED 120 and the heat generating device 135. The heat spreading device 130 may have a size that is as big as the display (OLED) in X-Y dimensions to effect an even distribution of heat to the OLED.

Figure 3:
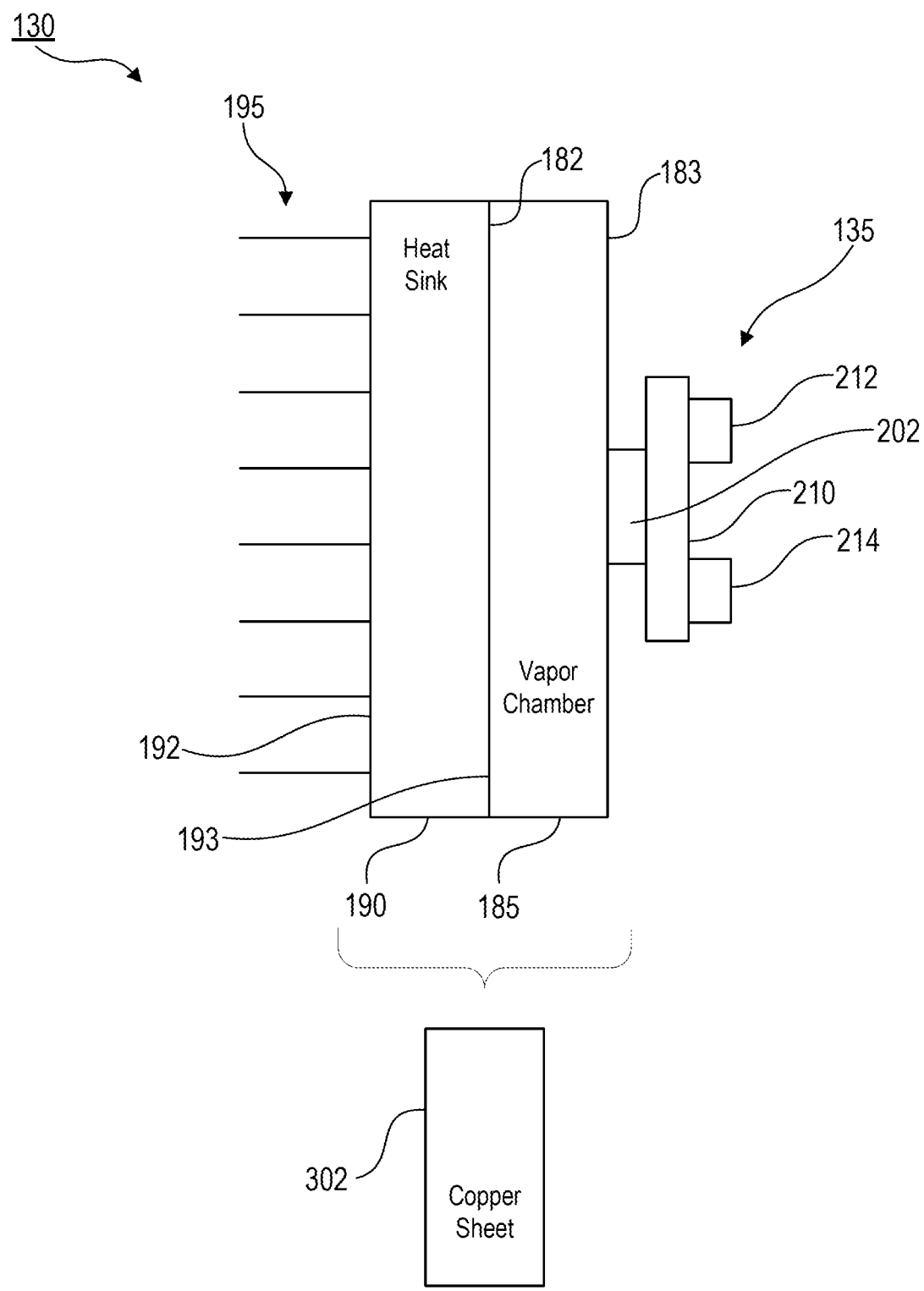
FIG. 3 is a side view of a vapor chamber and a heat sink according to an example embodiment.

FIG. 3 is a side view of a vapor chamber and a heat sink according to an example embodiment. Other embodiments and configurations may also be provided.

A vapor chamber may be a planar heat pipe that spreads heat from a concentrated heat source (or sources) to a large area heat sink with effective thermal conductivities. The vapor chamber may include a sealed chamber and a small amount of fluid that is in equilibrium with its own vapor. As heat is applied at a small area, the fluid may vaporize and the vapor may spread to the entire inner volume and condense over a much larger surface.

The heat spreading device 130 may include a vapor chamber 185 and a heat sink 190 as shown in FIG. 3. The vapor chamber 185 may have a first surface 182 (or front surface) and a second surface 183 (or rear surface).

The heat sink 190 may include a first surface 192 (or front surface) and a second surface 193 (or rear surface). The second surface 193 of the heat sink 190 may directly contact the first surface 182 of the vapor chamber 185. The heat sink 190 may include a plurality of fins 195 that extend from the first surface 192 (of the heat sink 190) toward the OLED 120.

In at least one embodiment, the fins 195 may directly contact the OLED 120. In at least one embodiment, a small air gap may be provided between the fins 195 and the OLED 120 for expansion and for providing an even thermal distribution under the OLED 120.

For other embodiments, an even thermal distribution may be achieved by using the vapor chamber alone (i.e., without the heat sink). The surface 182 of the vapor chamber 185 may be in direct contact to the bottom side of the OLED, or a small allowance of air gap (0.2-1 mm) may be allocated between the bottom of the OLED 120 and the surface 182 of the vapor chamber 185.

The heat generating device 135 may be provided directly on the second surface 183 of the vapor chamber 185. Operating components of the heat generating device 135 may produce heat that may vaporize fluid within the vapor chamber 185. The vapor may spread to the entire first surface 182 of the vapor chamber 185. Heat at the second surface 193 (of the heat sink 190) may be provided to the first surface 192 (of the heat sink 190). The heat may then be provided to the fins 195. In at least one embodiment, the fins 195 may directly contact the OLED 120. In at least one embodiment, the fins 195 may be separated from the OLED 120 by a small air gap.

FIG. 3 shows one example of the heat generating device 135. Other example structures and configurations may also be provided. The heat generating device 135 may include a processor 202 that is mounted on (or attached to) a circuit board 210. A top surface of the processor 202 may directly contact the second surface 183 of the vapor chamber 185. In at least one embodiment, the processor 202 may directly contact a central area of the second surface 183 of the vapor channel 185. During operation, heat generated by the processor 202 may propagate to the second surface 183 of the vapor chamber 185. Due to the central location, heat may be uniformly spread.

Other electronic components may be mounted on (or attached to) the circuit board 210. For example, FIG. 3 shows other components 212, 214 on one side of the circuit board 210. The components 212, 214 may include, but are not limited to, inductors, resistors, audio codec, connectors, Power Management Integrated Circuit (PMIC), WiFi and WWAN modules.

FIG. 3 shows the heat sink 190 at the first surface 182 of the vapor chamber 185. In at least one embodiment, the heat sink 190 may directly contact the OLED 120.

In at least one embodiment, the heat sink 190 may not be provided as part of the heat spreading device 130. In such an example, the OLED 120 may directly contact the first surface 182 of the vapor chamber 185. Heat may then be provided directly from the vapor chamber 185 to the OLED 120. In at least one embodiment, a sheet of copper 302 (or approximately 1 mm thick) may be provided rather than the vapor chamber 185 and the heat sink 190. The sheet of cooper 302 may act as a heat spreader and also provide even thermal distribution to the OLED.

Figure 4A:
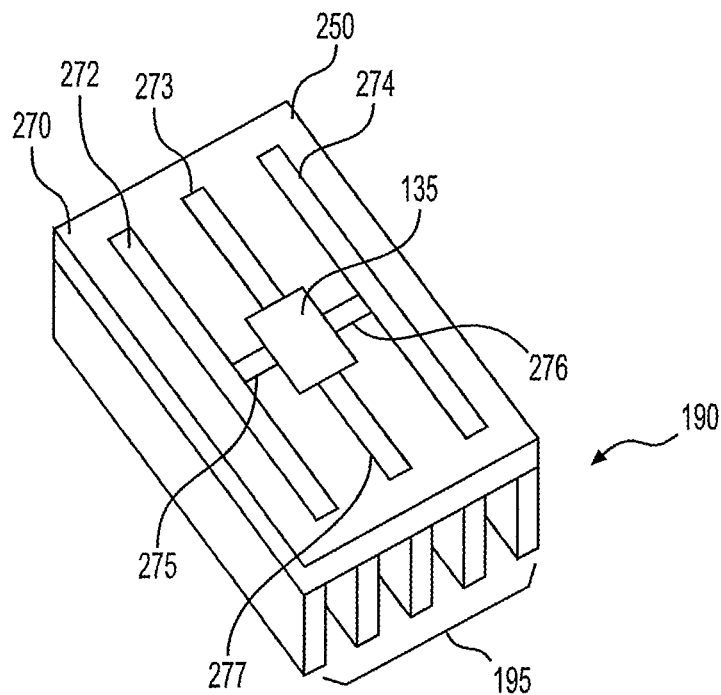
FIG. 4A is a view of a heat pipe structure according to an example embodiment.
Figure 4B:
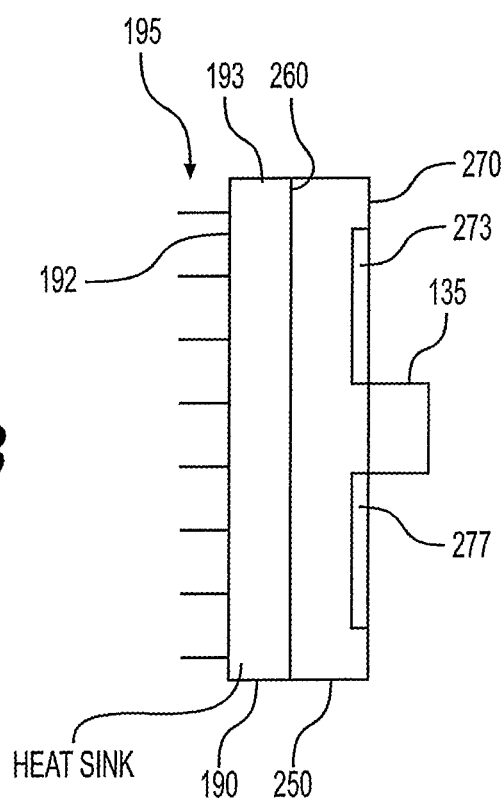
FIG. 4B is a side view of a heat pipe structure and a heat sink according to an example embodiment.

FIG. 4A is a view of a heat pipe structure according to an example embodiment. FIG. 4B is a side view of the heat pipe structure and a heat sink according to an example embodiment. Other embodiments and configurations may also be used.

The heat spreading device 130 may include a heat pipe structure 250 and a heat sink 190 as shown in FIG. 4B. FIG. 4A shows one example of the heat pipe structure. Other examples may also be used.

The heat pipe structure 250 may have a first surface 260 (or front surface) and a second surface 270 (or rear surface).

FIG. 4A shows a plurality of heat pipes 272-277 that may be embedded at the second surface 270 of the heat pipe structure 250. The heat generating device 135 may be provided at the second surface 270 of the heat pipe structure 250. The heat pipes 272-277 may be embedded in a manner to dissipate heat from the heat generating device 135 (at a central location) to other locations of the second surface 270.

The heat sink 190 may directly contact the first surface 260 of the heat pipe structure 250. More specifically, the second surface 193 of the heat sink 190 may directly contact the first surface 260 of the heat pipe structure 250. The plurality of fins 195 may extend from the first surface 192 of the heat sink 190 toward the OLED 120.

The heat generating device 135 may be provided directly on or at the second surface 270 of the heat pipe structure 250. Operating components of the heat generating device 135 may produce heat that may be distributed by the heat pipes 272-277. The distributed heat may be provided to the first surface 260 of the heat pipe structure 250. The heat may then be provided to the fins 195. The fins may directly contact the OLED 120.

FIG. 4B shows the heat sink 190 at the first surface 260 of the heat pipe structure 250. In at least one embodiment, the heat sink 190 may directly contact the OLED 120. In at least one embodiment, a small air gap may be provided between the fins 195 and the OLED 120.

In at least another embodiment, the heat sink 190 may not be provided as part of the heat spreading device 130. In such an example, the OLED 120 may directly contact the first surface 260 of the heat pipe structure 250. Heat may then be provided directly from the heat pipe structure 250 to the OLED 120. Alternatively, in such an example without the heat sink, a small allowance of air gap may be allocated between the bottom of the OLED 120 and the first surface 260 of the heat pipe structure 250.

FIGS. 3, 4A and 4B show the heat spreading devices as including a vapor chamber and a heat pipe structure. The above-described vapor chamber and heat pipes may be considered heat spreaders. For example, heat spreaders may be used to transfer heat from a small circuit board (and processor) to a larger area of the OLED 120.

The heat spreading device may spread and dissipate heat from the heat generating device and lower a driving voltage of the OLED and/or lower a power drain on the OLED. In at least one embodiment, the OLED may be considered a secondary heat sink of the electronic device 100. For example, an increases of a temperature of the OLED due to absorption of heat from the heat separating device is to lower the driving voltage of the OLED and is lower the power drain on the OLED.

The larger area of the OLED structure may serve as a thermal dissipation means for the electronic system. A temperature increase of the OLED structure may reduce a driving voltage of the OLED structure to improve power efficiency of the electronic system as OLED behaves like a semiconductor and charge carriers density in the conducting band increases with the temperature.

The following examples pertain to further embodiments.

Example 1 is an electronic device comprising: an organic light emitting display (OLED); and a heat generating device to provide signals to the OLED; and a heat spreading device between the OLED and the heat generating device, the heat generating device directly contacts the heat spreading device, the heat spreading device is configured to dissipate heat generated by the heat generating device to the OLED.

In Example 2, the subject matter of Example 1 can optionally include the heat generating device includes a processor, and the processor to directly contact the heat spreading device.

In Example 3, the subject matter of Example 1 and Example 2 can optionally include the heat generating device includes a circuit board, and the processor to be attached to the circuit board.

In Example 4, the subject matter of Example 1 and any one of Examples 2-3 can optionally include the processor to directly contact a center area of a surface of the heat generating device.

In Example 5, the subject matter of any one of Examples 1-3 can optionally include the heat spreading device includes a vapor chamber having a first surface and a second surface.

In Example 6, the subject matter of Example 1 and Example 5 can optionally include the heat generating device contacts the second surface of the vapor chamber.

In Example 7, the subject matter of Example 1 and Example 6 can optionally include the heat spreading device includes a heat sink having a first surface, a second surface, and a plurality of fins that extend from the first surface of the heat sink toward the OLED.

In Example 8, the subject matter of Example 1 and Example 7 can optionally include the second surface of the heat sink directly contacts the first surface of the vapor chamber.

In Example 9, the subject matter of Example 1 and Example 7 can optionally include the plurality of fins directly contact the OLED.

In Example 10, the subject matter of any one of Examples 1-3 can optionally include the heat spreading device includes a heat pipe structure having a first surface, a second surface and a plurality of heat pipes at the second surface of the heat pipe structure.

In Example 11, the subject matter of Example 1 and Example 10 can optionally include the heat generating device contacts the second surface of the heat pipe structure.

In Example 12, the subject matter of Example 1 and Example 10 can optionally include the heat spreading device includes a heat sink having a first surface, a second surface, and a plurality of fins that extend from the first surface of the heat sink toward the OLED.

In Example 13, the subject matter of Example 1 and Example 12 can optionally include the second surface of the heat sink directly contacts the first surface of the heat pipe structure.

In Example 14, the subject matter of Example 1 and Example 12 can optionally include the plurality of fins directly contact the OLED.

In Example 15, the subject matter of any one of Examples 1 and 5 and 10 can optionally include the heat spreading device to spread and dissipate the heat from the heat generating device and lower the driving voltage of the OLED.

In Example 16, the subject matter of any one of Examples 1 and 5 and 10 can optionally include the heat spreading device to spread and dissipate the heat from the heat generating device and lower a power drain on the OLED.

In Example 17, the subject matter of any one of Examples 1 and 5 and 10 can optionally include the heat spreading device to uniformly spread the heat across the OLED.

In Example 18, the subject matter of Example 1 can optionally include the OLED is a secondary heat sink of the electronic device.

In Example 19, the subject matter of Example 1 can optionally include an increase of a temperature of the OLED due to absorption of heat from the heat separating device is to lower a driving voltage of the OLED and is to lower a power drain on the OLED.

Example 20 is an electronic device comprising: an organic light emitting display (OLED); a heat generating device to provide heat; and a heat spreading device to contact the OLED and to contact the heat generating device, and the heat spreading device to dissipate the heat from the heat generating device and lower a driving voltage of the OLED.

In Example 21, the subject matter of Example 20 can optionally include the heat generating device includes a processor, and the processor to directly contact the heat spreading device.

In Example 22, the subject matter of Example 20 and Example 21 can optionally include the heat generating device includes a circuit board, and the processor to be attached to the circuit board.

In Example 23, the subject matter of Example 20 and any one of Examples 21-22 can optionally include the processor to directly contact a center area of a surface of the heat generating device.

In Example 24, the subject matter of any one of Examples 20-22 can optionally include the heat spreading device includes a vapor chamber having a first surface and a second surface.

In Example 25, the subject matter of Example 20 and Example 24 can optionally include the heat generating device contacts the second surface of the vapor chamber.

In Example 26, the subject matter of Example 20 and Example 25 can optionally include the heat spreading device includes a heat sink having a first surface, a second surface, and a plurality of fins that extend from the first surface of the heat sink toward the OLED.

In Example 27, the subject matter of Example 20 and Example 26 can optionally include the second surface of the heat sink directly contacts the first surface of the vapor chamber.

In Example 28, the subject matter of Example 20 and Example 26 can optionally include the plurality of fins directly contact the OLED.

In Example 29, the subject matter of any one of Examples 20-22 can optionally include the heat spreading device includes a heat pipe structure having a first surface, a second surface and a plurality of heat pipes at the second surface of the heat pipe structure.

In Example 30, the subject matter of Example 20 and Example 29 can optionally include the heat generating device contacts the second surface of the heat pipe structure.

In Example 31, the subject matter of Example 20 and Example 30 can optionally include the heat spreading device includes a heat sink having a first surface, a second surface, and a plurality of fins that extend from the first surface of the heat sink toward the OLED.

In Example 32, the subject matter of Example 20 and Example 31 can optionally include the second surface of the heat sink directly contacts the first surface of the heat pipe structure.

In Example 33, the subject matter of Example 20 and Example 31 can optionally include the plurality of fins directly contact the OLED.

In Example 34, the subject matter of any one of Examples 20, 24 and 29 can optionally include the heat spreading device to spread and transfer the heat from heat generating device to the OLED.

In Example 35, the subject matter of any one of Examples 20, 24 and 29 can optionally include the heat spreading device to uniformly spread the heat across the OLED.

In Example 36, the subject matter of Example 20 can optionally include the OLED is a secondary heat sink for the electronic device.

In Example 37, the subject matter of Example 20 can optionally include an increase of a temperature of the OLED due to absorption of heat from the heat spreading device is to dissipate the heat from the heat generating device and lower the driving voltage of the OLED.

Example 38 is an electronic device comprising: an organic light emitting display (OLED); heating means for providing heat and signals to the OLED; and spreading means for dissipating the heat from the heating means and lowering a driving voltage of the OLED.

In Example 39, the subject matter of Example 38 can optionally include the heating means includes a processor, and the processor to directly contact the spreading means.

In Example 40, the subject matter of Example 38 and Example 39 can optionally include the heating means includes a circuit board, and the processor to be attached to the circuit board.

In Example 41, the subject matter of Example 38 and any one of Examples 39-40 can optionally include the processor to directly contact a center area of a surface of the heating means.

In Example 42, the subject matter of any one of Examples 38-40 can optionally include the spreading means includes a vapor chamber having a first surface and a second surface.

In Example 43, the subject matter of Example 38 and Example 42 can optionally include the heating means contacts the second surface of the vapor chamber.

In Example 44, the subject matter of Example 38 and Example 43 can optionally include the spreading means includes a heat sink having a first surface, a second surface, and a plurality of fins that extend from the first surface of the heat sink toward the OLED.

In Example 45, the subject matter of Example 38 and Example 44 can optionally include the second surface of the heat sink directly contacts the first surface of the vapor chamber.

In Example 46, the subject matter of Example 38 and Example 44 can optionally include the plurality of fins directly contact the OLED.

In Example 47, the subject matter of any one of Examples 38-40 can optionally include the spreading means includes a heat pipe structure having a first surface, a second surface and a plurality of heat pipes at the second surface of the heat pipe structure.

In Example 48, the subject matter of Example 38 and Example 47 can optionally include the heating means contacts the second surface of the heat pipe structure.

In Example 49, the subject matter of Example 38 and Example 47 can optionally include the spreading means includes a heat sink having a first surface, a second surface, and a plurality of fins that extend from the first surface of the heat sink toward the OLED.

In Example 50, the subject matter of Example 38 and Example 49 can optionally include the second surface of the heat sink directly contacts the first surface of the heat pipe structure.

In Example 51, the subject matter of Example 38 and Example 49 can optionally include the plurality of fins directly contact the OLED.

In Example 52, the subject matter of any one of Examples 38, 42 and 47 can optionally include the spreading means for spreading and dissipating heat from the heating means and lowering the driving voltage of the OLED.

In Example 53, the subject matter of any one of Examples 38, 42 and 47 can optionally include the spreading means for spreading and dissipating heat from the heating means and lowering a power drain on the OLED.

In Example 54, the subject matter of any one of Examples 38, 42 and 47 can optionally include the spreading means for uniformly spreading the heat across the OLED.

In Example 55, the subject matter of Example 38 can optionally include the OLED is a secondary heat sink of the electronic device.

In Example 56, the subject matter of Example 38 can optionally include an increase of a temperature of the OLED due to absorption of heat from the heat separating device is to lower the driving voltage of the OLED and is to lower a power drain on the OLED.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic device comprising:
   an organic light emitting display (OLED);
   a heat generating device to provide heat; and
   a heat spreading device to contact the OLED and to contact the heat generating device, the heat spreading device comprising a vapor chamber.

2. The electronic device of claim 1, wherein the vapor chamber extends at least halfway along a length of the OLED.

3. The electronic device of claim 1, wherein the heat spreading device comprises a heat sink, the heat sink in contact with the vapor chamber.

4. The electronic device of claim 1, wherein the heat generating device comprises a processor.

5. The electronic device of claim 4, wherein the heat generating device comprises a circuit board, and the processor is attached to the circuit board.

6. The electronic device of claim 1, wherein the vapor chamber is to distribute the heat from the heat generating device to the OLED and lower a driving voltage of the OLED.

7. The electronic device of claim 1, wherein an increase of a temperature of the OLED due to absorption of heat from the vapor chamber is to lower a driving voltage of the OLED and is to lower a power drain on the OLED.

8. The electronic device of claim 1, further comprising a battery.

9. The electronic device of claim 8, wherein the heat spreading device is to contact the battery.

10. An electronic device comprising: an organic light emitting display (OLED); a heat generating device to provide heat; and a heat spreading device to transfer heat from the heat generating device to the OLED, wherein the OLED has a width and a length, wherein at least part of the heat spreading device extends along substantially the entire width and length of the OLED.

11. The electronic device of claim 10, wherein the heat spreading device comprises a copper sheet, wherein the copper sheet extends along substantially the entire width and length of the OLED.

12. The electronic device of claim 10, wherein the at least part of the heat spreading device that extends along substantially the entire width and length of the OLED is in contact with the OLED.

13. The electronic device of claim 10, wherein the heat spreading device comprises a vapor chamber, wherein the vapor chamber extends at least halfway along a length of the OLED.

14. The electronic device of claim 13, wherein the heat spreading device comprises a heat sink, the heat sink in contact with the vapor chamber.

15. The electronic device of claim 10, wherein the heat generating device comprises a processor.

16. The electronic device of claim 15, wherein the heat generating device comprises a circuit board, and the processor is attached to the circuit board.

17. The electronic device of claim 10, wherein the heat spreading device is to distribute the heat from the heat generating device to the OLED and lower a driving voltage of the OLED.

18. The electronic device of claim 10, further comprising a battery.

19. The electronic device of claim 18, wherein the heat spreading device is to contact the battery.

20. An electronic device comprising: an organic light emitting display (OLED); a heat generating device to provide heat; and means for heat spreading, the means for heat spreading to contact the OLED and contact the heat generating device, the means for heat spreading to distribute the heat from the heat generating device to the OLED.

21. The electronic device of claim 20, wherein the means for heat spreading extends at least halfway along a length of the OLED.

22. The electronic device of claim 20, wherein the means for heat spreading comprises a heat sink, the heat sink in contact with a vapor chamber.

23. The electronic device of claim 20, wherein the heat generating device comprises a processor.

24. The electronic device of claim 23, wherein the heat generating device comprises a circuit board, and the processor is attached to the circuit board.

25. The electronic device of claim 20, wherein the means for heat spreading is to lower a driving voltage of the OLED.

\* \* \* \* \*